United States Patent [19]

Virgilio

[11] Patent Number: 5,625,285

[45] Date of Patent: Apr. 29, 1997

[54] AC POWER OUTLET GROUND INTEGRITY AND WIRE TEST CIRCUIT DEVICE

[75] Inventor: Larry A. Virgilio, Lake Zurich, Ill.

[73] Assignee: A. W. Sperry Instruments, Inc., Hauppauge, N.Y.

[21] Appl. No.: 457,236

[22] Filed: Jun. 1, 1995

[51] Int. Cl.⁶ .................................................. G01R 31/02
[52] U.S. Cl. .............................................. 324/133; 324/508
[58] Field of Search .................................... 324/725, 133, 324/508, 509, 510, 520, 539; 360/650, 651, 656, 649; 361/42

[56] References Cited

U.S. PATENT DOCUMENTS

| | | |
|---|---|---|
| 3,774,106 | 11/1973 | MacPhee . |
| 3,863,238 | 1/1975 | Rowell . |
| 3,904,958 | 9/1975 | Gartland, Jr. et al. ............. 324/133 |
| 3,984,765 | 10/1976 | Rocci, Jr. ................................ 324/508 |
| 3,996,496 | 12/1976 | Volk, Jr. . |
| 4,082,995 | 4/1978 | Rhude ..................................... 324/508 |
| 4,127,807 | 11/1978 | Peplow et al. ..................... 324/508 |
| 4,164,701 | 8/1979 | Gulledge et al. . |
| 4,164,702 | 8/1979 | Pereda . |
| 4,394,615 | 3/1989 | Rocci, Jr. . |
| 4,929,887 | 5/1990 | Robitaille et al. . |
| 5,051,732 | 9/1991 | Robitaille . |
| 5,099,212 | 3/1992 | Nagaishi ................................ 324/508 |
| 5,285,163 | 2/1994 | Liotta . |
| 5,367,250 | 11/1994 | Whisenand . |

*Primary Examiner*—Vinh P. Nguyen
*Attorney, Agent, or Firm*—Howard C. Miskin

[57] ABSTRACT

A self-contained, plug-in, hand-held device for testing the current carrying ability of the Hot wire and the Safety Ground return of standard AC outlets which have Hot, Neutral and Ground connections. The test circuit device also detects common miswires and open connections in the AC outlet being tested by way of flashing lights built into the tester unit. If the AC outlet is wired correctly and the total resistance of the Hot and Safety Ground are below a predetermined limit, only one light "Green" meaning "OK" will flash, which use of only one light to indicate everything is properly wired makes the device easy to use even by a user with little knowledge of electrical testing devices and procedures. Various other detection conditions and indications of occurrence are afforded by the test circuit device.

9 Claims, 1 Drawing Sheet

AC POWER OUTLET GROUND INTEGRITY AND WIRE TEST CIRCUIT DEVICE

FIELD OF THE INVENTION

The present invention relates to devices for monitoring and testing electrical power supply devices, and more particularly to and for a standard 3-Wire 120 volt AC electrical outlet, which assures the user that the outlet has been wired properly and has acceptable grounding properties.

BACKGROUND OF THE INVENTION

For many years it has been known that the safety ground in AC outlets in important, this ground connection will shunt current which can appear on the enclosure of the tool or appliance, due to a defect in insulation, harmlessly to ground. If the enclosure were not properly grounded and the hot wiring of the power tool were to short to the case, the user could suffer injury or death if he or she were standing on a surface which had a path to earth ground or were touching a surface which was connected to earth ground. If the tool being used were to develop such a fault and the outlet wiring was proper, a large amount of current would flow from the HOT wire of the AC outlet through the tool and back through the safety ground of the AC outlet, thus exceeding the current rating of the circuit breaker or fuse which protects the wiring and tripping the breaker or blowing the fuse. It now becomes apparent that the total resistance of the HOT and SAFETY GROUND must have a value low enough to allow a current exceeding the rating of the circuit breaker or fuse to flow thus insuring that the power to the circuit will be interrupted due to such a fault.

Most 120 VAC circuit breakers have a rating of 20 amps. Using Ohms Law only, we find that the total resistance of the wiring from the main panel to the AC outlet and the connection from the AC outlet to earth ground must not exceed 6 ohms. If this total resistance is greater than 6 ohms, the breaker may not trip during a fault and a dangerous condition in terms of fire hazard or shock will result. The potential for poor electrical connections to earth ground are the most prevalent since these connections are usually made through the metallic conduit which carries the wiring. This conduit typically has many couplings and connections through junction boxes between the AC outlets and the connection to earth ground which usually terminates at the power panel. In addition to faulty assembly of these ground returns, the connections over time may loosen or corrode causing the resistance to increase.

As shown in the example above, the total resistance of the circuit must not be greater than 6 ohms. The most popular outlet tester on the market uses neon bulbs to indicate AC outlet miswires, these lamps requiring only 1 or 2 milliamperes to light or turn on. A faulty ground connection having a resistance as high as 120,000 ohms will light the lamp in this type of tester and the user will assume the outlet is safe to use when it is not.

It becomes apparent that more than 1 or 2 milliamperes is required to properly exercise these wiring connections, but a problem arises with ground fault interrupter outlets. These outlets will trip if more than 3 milliamperes of current flow from the HOT WIRE and through the ground return of the outlet. Thus, a tester which causes more than 3 milliamperes to flow through these wires during testing is not usable since the interrupter would trip every time it was tested. Applicant has found that the solution to this problem is to draw high current short duration pulses, currents exceeding 20 amps may be drawn from the HOT WIRE to EARTH GROUND through the outlet without tripping the interrupter, if the duration is short enough. A total duration of 3 to 5 microseconds with peak currents of 20 amps or more will not trip these interrupters and the resistance of the wiring can now be determined by detecting the amplitude of the current pulses. If the total resistance of the circuit is lower than a predetermined limit, the peak current will be high enough to trigger a light indicating the outlet is safe to use.

In view of that set forth above and other known deficiencies of the prior art for testing not only that an AC outlet is properly wired but also to determine any defect in the connection of the hot, neutral and ground wire connections, and further to detect a defective ground, the present invention provides the following advantages.

It is an object of the invention to provide a tester unit for detecting and indicating the occurrence of proper wiring of a tested AC outlet, a defective ground, an open Neutral, reversed Hot and Neutral connections, a connection wherein "Hot on Neutral with open Neutral" occurs, and an open Hot connection.

It is another object of the invention to assure the user that the AC outlet has been wired properly and the total resistance of the Hot wire and the Ground return is below 6 ohms.

Various other objects and advantages of the present invention will be made known upon reading and understanding the detailed description of the invention which follows.

SUMMARY OF THE INVENTION

The foregoing objects of the invention are achieved in an AC POWER OUTLET GROUND INTEGRITY AND WIRING TESTER UNIT DEVICE AND CIRCUIT having three LED's "Red" "Green" and "Yellow", which LED's are actuated or energized to indicate any occurrence of proper and improper wiring connections of the Hot, Neutral, and Ground wires of the AC outlet, such being accomplished by operative circuitry including three relaxation oscillator circuits, each incorporating therein a LED indicator device to indicate the occurrence of a specific wiring condition, with all three of these oscillator circuits being contained in the tester unit/device and being connected between any of the Hot, Ground, and Neutral wiring connections of an AC outlet when the tester unit is plugged into the outlet.

BRIEF DESCRIPTION OF THE DRAWING

The novel features of the invention are set forth in the appended claims. The invention itself will be described with reference to the illustrative preferred embodiment depicted in the accompanying FIG. 1 drawing.

DETAILED DESCRIPTION OF THE PREFERRED EMBODIMENT

Figure 1:
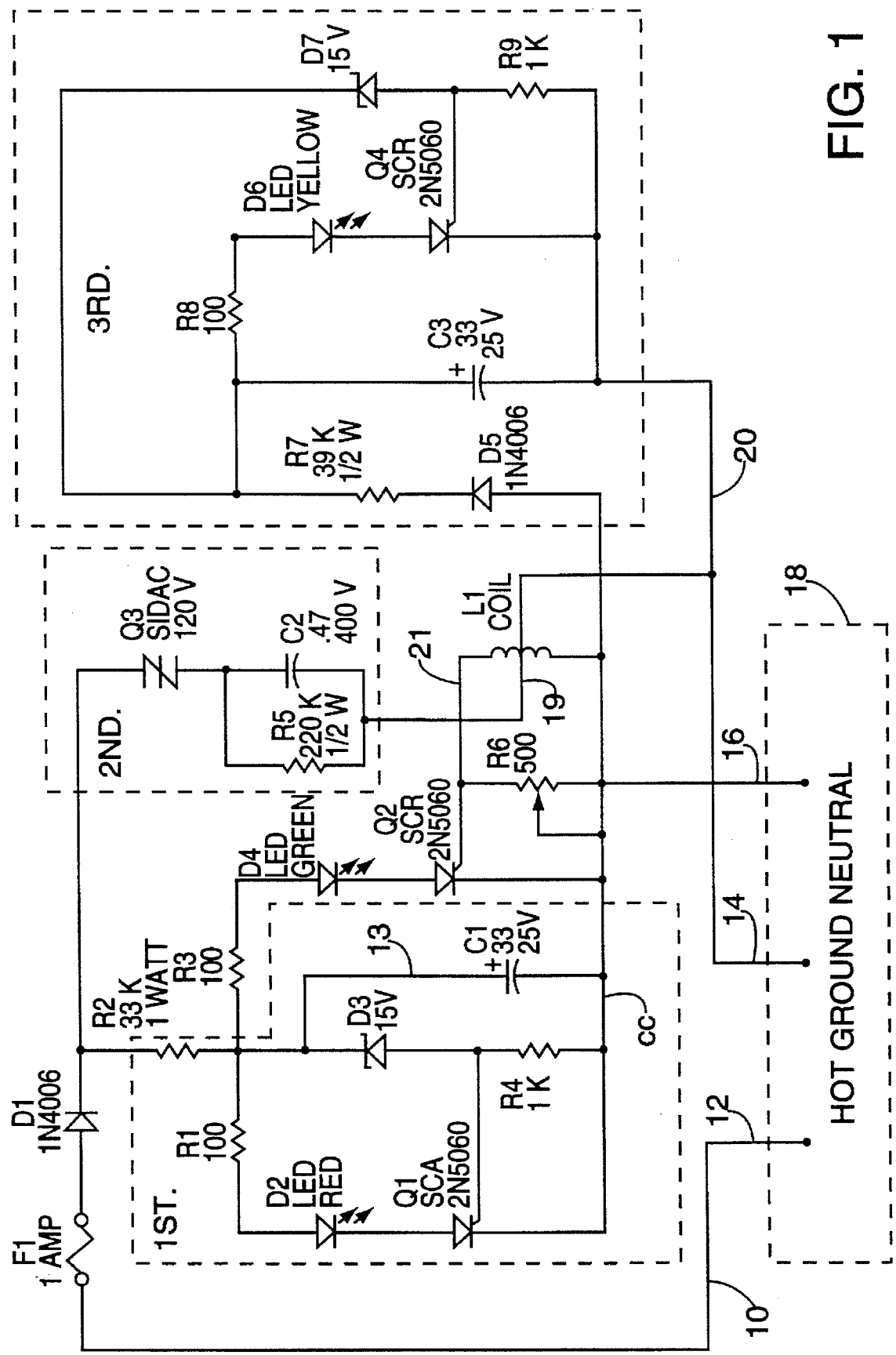

With reference to FIG. 1, there is depicted an electrical AC outlet monitoring and testing circuit device 10 that includes a first indicator light, a second indicator light, and a third indicator light. In a preferred embodiment of tester 10, the first indicator light is a Green LED D4, the second indicator light is a Red LED D2, and the third indicator light is a Yellow LED D6. Only the Green LED D4 will light or flash when the AC outlet is wired correctly and a total resistance, which is defined as the arithmetic sum of the resistances of the HOT WIRE and of the Ground return, is below a predetermined ohmic resistance limit. As discussed in the "Background" section, safety considerations dictate that for testing a standard 120 volt AC outlet, the predetermined ohmic resistance limit be set at about 6 ohms for a corresponding 20 (120 volts/6Ω) amperage current breaker. However, by using Ohm's Law this predetermined ohmic resistance limit may be set to accommodate any amperage circuit breaker operating on any voltage including those other than 120 volts. Each of the LED's, when lit or energized, will flash briefly several times a second. The chart below shows the various faults and flashing light combinations for wiring faults that may be detected by tester 10.

| LED's FLASHING | FAULT |
| --- | --- |
| Green | All Connections Okay |
| Red | Defective Ground |
| Yellow & Green | Open Neutral |
| Yellow & Red | Reverse Hot & Neutral |
| Yellow | Hot On Neutral With Open Neutral |
| None | Open Hot or Open Ground And Neutral |

The invention circuit simplicity, as shown in FIG. 1, will allow it to fit into a small hand-held, plug-in type enclosure, not shown. It is also self-powered from the AC line (outlet). Power is supplied from the Hot AC wire line 12 through Fuse F1 through Diode D1 and through current limiting resistor R2 to capacitor C1 via circuit line 13. The voltage capacitor C1 will charge to is limited to 15 volts which is controlled by zener diode D3 which is connected in series with resistor R4 to circuit common CC which is connected to the Neutral wire line 16 of the AC outlet 18 under test. The 15 volts appearing at the junction R2, D3, and C1 is connected to a current limiting resistor R1 which is connected to LED D2 which is connected to the anode of SCR Q1. The cathode of Q1 is connected to circuit common CC and the gate of Q1 is connected to the junction of D3 and R4. When the unit is plugged into the AC power outlet and power is applied to the invention circuit, the voltage across C1 will cause current to flow through zener diode D3 and resistor R4. The current through R4 will cause a voltage exceeding 0.6 volts to be developed across it and this voltage will then cause a current to flow into the gate of SCR Q1 which will cause Q1 to conduct current and light or energize LED D2. LED D2 will remain on only briefly since the energy stored in capacitor C1 will be rapidly depleted and the current through Q1 will fall below its holding current. When Q1 turns off, due to the lack of sufficient holding current, the voltage across capacitor C1 will again begin to rise and the cycle will repeat. The circuit described so far is a complete self-contained first relaxation oscillator which will flash or light the LED D2 at a rate determined by the applied line voltage and the predetermined values of R2, D3, R4 and C1. The operation of this first relaxation oscillator will be inhibited if the voltage across capacitor C1 is kept below the zener voltage of D3. This brings us to the second part of the circuit: Resistor R3, LED D4, and SCR Q2, which are connected in series with each other between R2 and CC. This series circuit is connected across or in parallel with capacitor C1. If Q2 is triggered before the voltage across C1 reaches 15 volts, then LED D4 will flash (be lit or energized intermittently) rather than LED D2. Q2 is triggered by the action of a second relaxation oscillator circuit comprised of diode D1, SIDAC Q3, and the parallel combination of resistor R5 and capacitor C2 which are coupled to the ground connection of the AC outlet 18 by way of a wire loop 19 around coil L1, and circuit line 20. This second relaxation oscillator will produce pulses at a predetermined rate two times that of the first relaxation oscillator mentioned above.

When power is applied to the tester 10, upon plug-in to outlet 18, capacitor C2 has no voltage across it. The voltage necessary to cause SIDAC Q3 to breakdown is 120 volts. Only the positive half cycles of the AC line voltage are passed by diode D1 and when the positive half of the line cycle reaches 120 volts, breakover device Q3 will become conductive causing capacitor C2 to rapidly charge in about 4 microseconds. At this time, the current through Q3 will fall below its holding current, and Q3 will turn off. C2 will now begin to discharge through resistor R5 and when the voltage across C2 has fallen to a voltage low enough to allow 120 volts to again appear across Q3, the cycle will be repeated again. With the component values shown in FIG. 1, Q3 will fire approximately six (6) times a second. Basically, the peak current that will flow is determined by the forward drop of diode D1, Q3 and the ESR of capacitor C2. Since these drops are very low, the main limit to the current flowing is the resistance of the AC wiring in outlet 18. The current flowing through the loop 19 around coil L1 induces a voltage in coil L1 which voltage is applied to the gate of Q2 "via circuit line 21" which has a variable resistor connected from the gate of Q2 to circuit common CC. This resistor R6 acts as a current shunt which controls the sensitivity of Q2, and R6 is set to prevent Q2 from triggering if the peak current pulse flowing in the loop 19 around coil L1 is below a predetermined level. If Q2 is not triggered due to insufficient current being sensed by coil L1, then the prior described first relaxation oscillator will become operative and the Red LED D2 will start to flash indicating a defective ground.

Open Neutral Wire Condition: This brings us to the third relaxation oscillator circuit which is configured like the first relaxation oscillator circuit except that it is connected across the Neutral and Ground connections of the AC outlet under test, via wire lines 14 and 16, and comprises: D5, R7, R8, C3, D7, R9, Q4, and LED D6 (Yellow). When the AC outlet is wired properly, no potential difference exists across these two points (Neutral and Ground) and this third oscillator is inoperative. If the Neutral wire is open, the current flowing from the circuit common CC for the first oscillator must now flow through the third relaxation oscillator via D5 et al., to reach ground potential. Thus, the first oscillator and the third oscillator are placed in series across the outlets' Hot and Ground lines. Since the second relaxation oscillator is operational causing the first relaxation oscillator to be inactive, both the Green and Yellow LED's D4 and D6 will now flash or be lit at a predetermined rate.

Reversed Hot and Neutral wires condition: Upon detection of this condition, no potential difference will exist across the second oscillator, and Q3 will not fire or conduct which will allow the Red LED D2 to flash or be lit at a predetermined rate. The fact that Neutral is now Hot and Hot is now Neutral makes no difference to the first oscillator. The Yellow LED D6 will also flash at a pre-set rate since the third oscillator will now be connected across 120 volts AC and because the Neutral wire will now be Hot.

Hot On Neutral With Open Neutral Condition: Only the Yellow LED D6 will light or flash at a pre-set rate since only the third oscillator circuit will have 120 volts across it. Here it is assumed that the Hot part/wire of the AC outlet is open and no wire is connected to it.

No Lights Flashing Condition: For this to occur, the AC outlet 18 would have to be "dead" (no Hot connection) or both the Neutral and Ground connections would have to be "open" at the same time.

It can now be seen from the foregoing disclosure that the present invention provides numerous advantages over the known prior art, and that the numerous fault detection operations of the invention unit are accomplished via a single self-contained, small hand-held, plug-in type, enclosure device which is powered from the AC line contained in the AC outlet under test.

With respect with the circuit components mentioned above and shown in FIG. 1: All resistor values are in ohms (±5%) and ¼ watt unless otherwise noted, and all capacitors are in ufd. (±10%).

Although the invention has been described with reference to a preferred embodiment, this description is not meant to be construed in a limiting sense. Various modifications of the disclosed embodiment, as well as alternative embodiments of the invention, will become apparent to persons of skill in the art upon reference to the description of the invention. It is therefore contemplated that the appended claims will cover such modifications that fall within the true scope of the invention.

I claim:

1. A self-contained, hand-held, plug-in device for testing the current carrying ability of the Hot wire and the safety Ground return wire of a standard AC outlet having Hot, Neutral, and Ground wire connections, the Hot wire and the Ground wire connections each having a resistance, the device comprising:

a test circuit for detecting occurrences of any miswired connections of the Hot, Neutral, and Ground connections of said AC outlet and for visually indicating such occurrences, said test circuit having light means actuable to indicate both a proper wiring condition of said AC outlet and the conditions including wherein a total resistance that is equal to the arithmetic sum of the resistances of the Hot wire and Ground wire connections is less than that required for safely tripping a circuit breaker of said AC outlet in response to a fault in which the Hot wire connection is accidentally coupled to the Ground wire connection, said light means being actuably coupled between the Hot and Neutral wire connections of said AC outlet under test, and wherein said test circuit is powered by the Hot wire connection of the AC outlet under test and eliminates any need for an internal power supply for said device, said test circuit having a circuit common (CC) that is connected to said Neutral connection and comprising;

(a) a first relaxation oscillator having first and second ends with the first end connected to said hot wire connection and said second end connected to said circuit common; said first relaxation oscillator having a first LED comprising said light means and arranged so as to repetitively render conductive and non-conductive said first LED in response to a first predetermined amplitude of voltage present between said first and second ends thereof;

(b) a second relaxation oscillator having first and second ends with the first end connected to said first end of said first relaxation oscillator and said second end connected to said Ground connection, said second relaxation oscillator having means for being rendered conductive in response to a second predetermined amplitude of voltage present between said first and second ends of said second relaxation oscillator;

(c) a third relaxation oscillator having first and second ends with the first end connected to said Neutral connection and said second end connected to said Ground connection, said third relaxation oscillator having a second LED comprising said light means and arranged so as to repetitively render conductive and non-conductive said second LED in response to a third predetermined amplitude of voltage present between the first and second ends of said third oscillator;

(d) an arrangement for operatively coupling together said first and second relaxation oscillators and having a third LED comprising said light means and arranged so as to repetitively render conductive said third LED while extinguishing said first LED in response to said means of second relaxation oscillator being rendered conductive.

2. The device of claim 1 wherein said first LED is actuable to indicate the occurrence of a defective ground condition and also the occurrence of a reversed Hot and Neutral connections condition of said AC outlet under test.

3. The device of claim 1 wherein said second relaxation oscillator controls the flashing pulse rate of the said third LED.

4. The device of claim 1 wherein said second LED is actuable to indicate the occurrence of an open Neutral condition, a reversed Hot and Neutral condition, and a Hot on Neutral with open Neutral condition.

5. The device of claim 1 wherein said test circuit inhibits the actuation of any of said light means, thereby indicting that the AC outlet wiring under test is defective.

6. The device of claim 1 wherein said oscillators are operable upon detection of an open Neutral condition to actuate said light means, and are further operable upon detection of said reversed Hot and Neutral condition to actuate said light means.

7. A method for testing the current carrying ability of the Hot wire and the safety Ground return wire of a standard AC outlet having Hot, Neutral and Ground wire connections, the method comprising the steps of:

a) providing a test circuit for detecting the occurrences of any miswired connections of the Hot, Neutral and Ground connections of said AC outlet and visually indicating such occurrences;

b) detecting and indicating via light means comprising first, second and third LEDs, said light means indicating both a proper wiring condition of the said AC outlet and a condition wherein a total resistance that is equal to the arithmetic sum of the resistances of the Hot wire and Ground wire connections is less than that required for safety tripping a circuit breaker of said AC outlet in response to a fault in which the Hot wire connection is accidentally coupled to the Ground wire connection;

c) powering said test circuit and said light means from the Hot wire connection of the said AC outlet under test; wherein the step of providing a test circuit comprises:

d) providing first, second and third relaxation oscillators and coupling means with a sensing device and said third LED, said coupling means operatively coupling together said first and second relaxation oscillators, said first and third relaxation oscillators respectively containing said first and second LEDs;

e) connecting said first relaxation oscillator between said Hot and Neutral connections and repetitively rendering said first LED conductive and non-conductive when the resistance between said Hot and Neutral connections exceeds that required for tripping said circuit breaker;

f) connecting said second relaxation oscillator between said Hot and Ground connections and rendering a switch means of said second relaxation oscillator conductive when the resistance between said Hot and Ground connections is less than that required for tripping said circuit breaker;

g) connecting said third oscillator between said Neutral and Ground connections and repetitively rendering said second LED conductive and non-conductive when the resistance between said Neutral and Ground connections exceeds that required for tripping said circuit breaker; and h) connecting said coupling means between said Ground and Neutral connections and arranging said coupling means as well as sensing means and said third LED so that said first LED is extinguished and said third LED is conductive when said switch means of said second relaxation oscillator is rendered conductive.

8. The method as defined in claim 7 includes the steps of detecting and indicating the occurrence of a defective Ground condition, an open Neutral condition, a reversed Hot and Neutral condition, a Hot on Neutral with open Neutral condition, an open Hot condition, and an open Ground and Neutral condition, as each condition occurs in said AC outlet under test.

9. A self-contained, hand-held, plug-in device for testing the current carrying ability of the Hot wire and the safety Ground return wire of a standard AC outlet having Hot, Neutral, and Ground wire connections, the Hot wire and the Ground wire connections each having a resistance, the device comprising:

a test circuit for detecting occurrence of any miswired connections of the Hot, Neutral, and Ground connections of said AC outlet and for visually indicating such occurrences, said test circuit having light means actuable to indicate both a proper wiring condition of said AC outlet and conditions including wherein a total resistance that is equal to the arithmetic sum of the resistances of the Hot wire and Ground wire connections is less than that required for safely tripping a circuit breaker of said AC outlet in response to a fault in which the Hot wire connection is accidentally coupled to the Ground wire connection, said light means being actually coupled between the Hot and Neutral wire connections of said AC outlet under test, and wherein said test circuit is powered by the Hot wire connection of the AC outlet under test and eliminates any need for an internal power supply for said device, said test circuit having a circuit common (CC) that is connected to said Neutral connection and comprising;

(a) a first relaxation oscillator having first and second ends with the first end connected to said Hot wire connection and the second end connected to said Neutral connection, said first relaxation oscillator having a serial arrangement comprising a first LED comprising said light means, a first capacitor and a first switch means, said first capacitor and said first switch means being arranged so that said first switch means is responsive to a first predetermined amplitude of voltage present between said first and second ends of said first relaxation oscillator so as to repetitively charge and discharge said first capacitor which, in turn, renders conductive and non-conductive said first LED;

(b) a second relaxation oscillator having first and second ends with the first end connected to said first end of said first relaxation oscillator and said second end connected to said Ground connection, said second relaxation oscillator having a serial arrangement comprising a first loop of wire, a second capacitor and a second switch means rendered conductive in response to a second predetermined amplitude of voltage present between said first and second ends of said second relaxation oscillator;

(c) a third relaxation oscillator having first and second ends with the first end connected to said Neutral connection and said second end connected to said Ground connection, said third relaxation oscillator comprising an arrangement comprising a diode having its anode connected to said Neutral connection and its cathode having means for being connected to one of a third connection, said arrangement further comprising a second LED comprising said light means and a third switch means being rendered conductive in response to a third predetermined amplitude of voltage present between said first and second ends of said third relaxation oscillator, said second LED and third switch means being arranged in parallel with said third capacitor so that said third switch means is responsive to said third predetermined amplitude so as to repetitively charge and discharge said third capacitor which, in turn, correspondingly renders conductive and non-conductive said second LED;

(d) an arrangement for operatively coupling together said first and second relaxation oscillators and having first and second ends respectively connected to said first and second ends of said first relaxation oscillator, said operatively coupling arrangement comprising a third LED comprising said light means having means for connecting its anode to the first end thereof, and a fourth switch means having anode, cathode and gate electrodes with the anode electrode connected to the cathode of said third LED and the cathode electrode connected to said Neutral connection and the gate electrode serially connected to a first coil having said first loop of wire of said second relaxation oscillator coupled thereto, said first coil receiving energy when said second switch means is rendered conductive which, in turn, renders said fourth switch means conductive which, in turn, renders conductive said third LED conductive while also bypassing said first capacitor to render said first LED non-conductive.

* * * * *